(12) United States Patent
Gerfers et al.

(10) Patent No.: US 12,176,925 B2
(45) Date of Patent: Dec. 24, 2024

(54) SIGMA-DELTA ANALOGUE-TO-DIGITAL CONVERTER WITH gmC-VDAC

(71) Applicant: TECHNISCHE UNIVERSITAT BERLIN, Berlin (DE)

(72) Inventors: Friedel Gerfers, Berlin (DE); Marcel Runge, Berlin (DE)

(73) Assignee: TECHNISCHE UNIVERSITAT BERLIN, Berlin (DE)

( * ) Notice: Subject to any disclaimer, the term of this patent is extended or adjusted under 35 U.S.C. 154(b) by 103 days.

(21) Appl. No.: 17/755,229

(22) PCT Filed: Oct. 23, 2020

(86) PCT No.: PCT/EP2020/079938
§ 371 (c)(1),
(2) Date: Apr. 25, 2022

(87) PCT Pub. No.: WO2021/078960
PCT Pub. Date: Apr. 29, 2021

(65) Prior Publication Data
US 2022/0407539 A1    Dec. 22, 2022

(30) Foreign Application Priority Data

Oct. 25, 2019   (DE) .......................... 102019128876.2

(51) Int. Cl.
*H03M 3/00*    (2006.01)
(52) U.S. Cl.
CPC ........... *H03M 3/422* (2013.01); *H03M 3/494* (2013.01)

(58) Field of Classification Search
CPC .............................. H03M 3/422; H03M 3/494
USPC ......................................... 341/143, 155, 144
See application file for complete search history.

(56) References Cited

U.S. PATENT DOCUMENTS

| | | |
|---|---|---|
| 6,584,157 B1 | 6/2003 | Van Der Zwan et al. |
| 9,154,149 B2 | 10/2015 | van Veldhoven et al. |
| 2004/0046605 A1* | 3/2004 | Granville ................ H03F 3/005 330/9 |

(Continued)

FOREIGN PATENT DOCUMENTS

| | | |
|---|---|---|
| EP | 2887553 A1 | 6/2015 |
| JP | H09-261856 A | 10/1997 |

(Continued)

OTHER PUBLICATIONS

International Search Report and Written Opinion for International PCT Application No. PCT/EP2020/079938, dated Feb. 1, 2021.

(Continued)

*Primary Examiner* — Peguy Jean Pierre
(74) *Attorney, Agent, or Firm* — K&L Gates LLP

(57) ABSTRACT

The present invention relates to a sigma-delta analogue-to-digital converter. The sigma-delta analogue-to-digital converter comprises a transconductance stage having first, second and third terminals. A capacitor is connected in parallel at the third terminal. Further, the sigma-delta analogue-to-digital converter comprises a quantiser at the third terminal of the transconductance stage with feedback by a voltage digital-to-analogue converter for feeding back a feedback signal to one of the terminals of the transconductance stage.

13 Claims, 11 Drawing Sheets

(56) References Cited

U.S. PATENT DOCUMENTS

2013/0194114 A1* 8/2013 Ritter ............... H03M 3/368
                                                    341/110
2015/0171882 A1  6/2015 van Veldhoven et al.
2015/0171889 A1* 6/2015 Melanson ........... H03M 3/424
                                                    341/110

FOREIGN PATENT DOCUMENTS

| JP | 2002519926 A  | 7/2002 |
|----|---------------|--------|
| JP | 2012044500 A  | 3/2012 |
| WO | 2021078960 A1 | 4/2021 |

OTHER PUBLICATIONS

Ritter et al., A Multimode CT ΔΣ-Modulator with a Reconfigurable Digital Feedback Filter for Semi-Digital Blocker/Interferer Rejection (Sep. 14, 2015), 225-228.
Sackinger et al., a Versatile Building Block: The CMOS Differential Difference Amplifier (Apr. 1987), 22(2): 287-294.
Torrance et al., CMOS Voltage to Current Transducers (Nov. 1985), 11:1097-1104.
Gray et al., MOS Operational Amplifier Design—A Tutorial Overview (Dec. 1982), 17(6):969-982.
Vajpayee et al., Low Voltage Regulated Cascode Current Mirrors suitable for Sub-1V Operation (Dec. 6, 2010), 584-587.
Debajit Basak et al, A Gm-C Delta-Sigma Modulator With a Merged Input-Feedback Gm Circuit for Nonlinearity Cancellation and Power Efficiency Enhancement, IEEE Transactions on Circuits and Systems I: Regular Papers, Sep. 1, 2017, vol. 65, No. 4, pp. 1196-1209.

* cited by examiner

SIGMA-DELTA ANALOGUE-TO-DIGITAL CONVERTER WITH gmC-VDAC

CROSS-REFERENCE TO RELATED APPLICATIONS

This application is a U.S. National Stage Entry under 35 U.S.C. § 371 of International Patent Application No. PCT/EP2020/079938, entitled SIGMA-DELTA ANALOGUE-TO-DIGITAL CONVERTER WITH GMC-VDAC, filed Oct. 23, 2020, which claims benefit to German Application No. 102019128876.2, filed Oct. 25, 2019. The entire disclosures of which are hereby incorporated by reference herein.

The present invention relates to a sigma-delta analogue-to-digital converter.

Sigma-delta analogue-to-digital converters are known in the art. The principle of sigma-delta modulation is based on measuring the input signal. The resulting measurement error is integrated and compensated step by step via feedback. FIG. 2 shows an example of a sigma-delta converter. The sigma-delta converter shown in FIG. 2 essentially has three components: a filter, in the simplest case an integrator 20 connected in series to a quantiser 12. The output signal y(n) of the quantiser 12 is fed back to the integrator 20 by feedback 14 via a digital-to-analogue converter 13 (DAC) via a summing element. In a real implementation, the output y(n) is a digital signal. The integrator represents an analogue block. Therefore, a digital-to-analogue converter 13 is used in the feedback to convert the digital signal to an analogue signal.

Known sigma-delta modulators (SDM), especially continuous-time (CT) sigma-delta modulators, use continuous-time integration. Generally, continuous-time integrators are designed as active resistor-capacitor (RC) integrators based on operational amplifiers. FIG. 3 shows a continuous-time integrator in the form of an RC integrator. The continuous-time integrator shown in FIG. 3 has an operational amplifier 24 (OpAmp) which converts the differential voltage at the two inputs to a proportional output current. In the feedback path of the operational amplifier 24, the capacitor 22 and the resistor 23 are connected as external circuitry. The time constant is determined using this circuitry. Due to the virtual mass of the operational amplifier, a current flows through the resistor, which is integrated on the capacitor 22 and generates the output voltage u(t). This is provided to a quantiser (not shown) to generate an output signal y(n). RC integrators have high integrator linearity and thus high analogue-to-digital converter accuracy. One disadvantage of RC integrators is the relatively high power dissipation of the operational amplifier. Another disadvantage is the fact that the time constant has to be set using the RC circuit.

Circuits with active gm-C or gm-LC filters (integrators) are an alternative and more energy-efficient design of the continuous-time implementation. A simple implementation of a gm-C integrator, as shown in FIG. 4, has a transconductance stage 11 (gm cell, transconductance amplifier) and a capacitor 11d at the output. A gm-LC filter also has an inductor (not shown) connected in parallel with the capacitor. The transconductance stage 11 converts the input voltage vin(t) to a current. The transconductance stage 11 is an active block which ensures a maximally constant quotient of output current and input voltage, and thus the voltage-current conversion of the input signal vin(t). The feedback current provided by the current digital-to-analogue converter 21 is subtracted from the input signal vin(t), and the difference is integrated via the capacitor 11d. In particular, the input signal vin(t) is converted to a current via the transconductance stage 11, and the output current of the current digital-to-analogue converter 21 is subtracted from gm*vin(t). The gmC integrator shown in FIG. 4 is designed as an open-loop gmC integrator, which is energy efficient. However, a disadvantage of this design is that the gm stage at the input sees the entire signal swing vin(t) (cf. FIG. 6), which results in high variation of the transconductance over the signal swing vin(t). Disadvantageously, this leads to high non-linearity of the integrator. The signal swing refers to the range of values that a signal can assume and thus describes the signal modulation level. FIG. 6 shows an example of the modulation level for the gm of the gmC integrator of FIG. 4. The gm results from the output current and the input signal Vin(t). FIG. 6 shows that the gm is not linear, but rather decreases and corresponds to the shape of a parabolic curve.

A possible alternative that improves linearity can be achieved by the gm-RC design as shown in FIG. 5. The resistor-DAC combination (R-DAC) creates a kind of "virtual GND" node at the front end of the gm-RC design, which reduces the signal swing at the input of the gm-RC design and thus improves linearity. A current is generated through the resistor 23, and the resulting difference between the current through the resistor 23 and the feedback current idac(t) becomes smaller, which also means that less signal swing is applied and the gm of the embodiment shown in FIG. 5 becomes more linear. The design shown in FIG. 5 has the disadvantage of requiring the resistor 23, which increases noise power. In addition, the input bandwidth is limited by the resistor 23. In this respect, this design can no longer be used for high bandwidths.

In another design, linearity may be achieved via source degeneration. In the simplest case, the source degeneration may comprise a transistor with a resistor. An increasing control signal of the transistor results in an increase of the current through the transistor due to the gm. At the same time, however, the voltage drop across the resistor increases, which simultaneously reduces the voltage Vgs (gate-source voltage) and thus also the effectiveness of the gm. Source degeneration can improve linearity but leads to very high thermal noise (gm reduction). In addition, this design has poor efficiency and consequently negative energy efficiency. An increased factor of energy has to be supplied in order to provide a comparable gm.

Thus, there is a need for an improved design of a sigma-delta converter, in particular a filter stage (integrator) for the sigma-delta converter. Based on the prior art shown and the need apparent from it, the object of the present invention is to provide a solution that at least partially overcomes the disadvantages known in the prior art.

A first aspect of the present invention comprises a sigma-delta analogue-to-digital converter according to the invention. The sigma-delta analogue-to-digital converter comprises a transconductance stage having a first terminal, a second terminal, a third terminal and a capacitor connected in parallel at the third terminal. Further, the sigma-delta analogue-to-digital converter comprises a quantiser at the third terminal of the transconductance stage. The output of the quantiser is connected to a feedback by a voltage digital-to-analogue converter for feeding back a feedback signal to one of the terminals of the transconductance stage.

The use of a conventional current-source DAC with an RC filter to feed back a feedback signal, as known from the prior art, has substantial disadvantages, such as the significant reduction of the signal-to-noise ratio of the converter due to the introduction of the additional noise source. Another disadvantage is the fluctuation of the resistance value R due to manufacturing variations as well as temperature changes, so that the amplitude of the current-source DAC with the RC filter changes, which reduces and degrades the accuracy of the converter.

The present invention is based on the knowledge that by using a voltage digital-to-analogue converter (VDAC) for a sigma-delta analogue-to-digital converter, the effective signal swing is reduced without the use of source degeneration, and thus a high signal-to-noise ratio (SNR) and high linearity with minimal power dissipation are achieved at the same time. In particular, it has been found that with the inventive approach, the signal swing of the gm stage—and thus the signal-to-noise ratio—and the linearity of the gm stage can be optimised independently without the use of an additional degeneration resistor.

Accordingly, the use of a voltage digital-to-analogue converter (VDAC) proves to be particularly advantageous over the problems of the prior art.

Furthermore, improved energy efficiency is also achieved. In particular, a constant performance can be achieved with less energy input, or an increase in performance and thus more bandwidth can be achieved with the same energy input. In addition, the form factor becomes significantly smaller and the noise, which means more power consumption, is improved.

The positioning of the quantiser directly at the third terminal, surprisingly, has also proved to be very advantageous. The effect was particularly surprising because the reduction of a filter arrangement—i.e., the direct connection of the quantiser to the first gm stage—usually reduces noise shaping and accordingly worsens the signal-to-noise ratio. This loss, however, was compensated for by the sigma-delta analogue-to-digital converter according to the invention and the associated higher sampling rate, the entire converter turning out to be more robust with respect to internal non-linearities of the filter or to further disturbances.

In particular, this also leads to a reduction in the space required for the converter, as the entire arrangement becomes more compact, which, among other things, also minimises the manufacturing costs, and in particular the cost of silicon.

Further advantageous refinements of the invention are the subject of the subclaims and the embodiments described below.

In one embodiment, the first terminal is configured as a non-inverting input and the second terminal is configured as an inverting input. The non-inverting input is configured to receive an analogue input voltage signal. The inverting input is connected to the digital-to-analogue converter (DAC). Advantageously, no resistor needs to be provided at the non-inverting input. Furthermore, a voltage is applied across the DAC which can be compared to the voltage applied to the non-inverting input.

The digital-to-analogue converter is designed as a voltage digital-to-analogue converter (VDAC). Via the voltage digital-to-analogue converter, an analogue voltage signal can be provided from a digital signal, for example a "WORD". Via the voltage digital-analogue signal, feedback of the sigma-delta analogue-to-digital converter output signal can take place.

In another embodiment, the maximum modulation level of the transconductance stage corresponds to the difference between the received input voltage signal and the feedback signal.

In another embodiment, a low-pass filter is connected in the feedback between the quantiser and the digital-to-analogue converter. This allows the quantisation noise to be minimised.

In another embodiment, the transconductance stage is configured as a single-ended transconductance stage with a first switching element and a second switching element. A differential signal swing can be provided via the single-ended transconductance stage.

In another embodiment, the first switching element and the second switching element are connected to a power source by a terminal via a voltage node and to the third terminal of the transconductance stage by a further terminal in each case via a summing element. The first switching element is switched via an input voltage signal and the second switching element is switched via a feedback signal at a respective control terminal. Due to the feedback, the feedback signal (Vdac(t)) follows the input voltage signal (Vin(t)). Via the summing element, the two differential currents can be subtracted from each other and made available to the resulting current at the output node.

In another embodiment, the transconductance stage is configured as a differential transconductance stage. The differential transconductance stage comprises a first differential pair input combination with a first switching element and a second switching element, which are interconnected in each case via a first terminal. In addition, the differential transconductance stage comprises a second differential pair combination with a third switching element and a fourth switching element, which are interconnected in each case via a first terminal. Advantageously, the input signal and the feedback signal can be combined in the gm stage such that a common mode signal is established at the corresponding source node of the differential pair input combinations. Thus, it can be advantageously ensured that the maximum modulation level of the gm stage corresponds only to the quantisation noise vq(t)=vd(t). In this respect, the concept of source degradation by a resistor is not necessary. The embodiment is thus significantly more energy efficient and, due to the small modulation level of the gm stage, a significant improvement in the linearity of the modulator can be achieved.

In another embodiment, the first differential pair input combination is connected via a voltage node and the second differential pair input combination is connected via a voltage node to a power source, respectively. The first and second differential pair input combinations each have a pair of switching elements, in particular a first and a second switching element, and a third and a fourth switching element. The further terminals of the first switching element and the third switching element have a common node, and the further terminals of the second switching element and the fourth switching element have a common node. The common nodes are each connected to the third terminal of the transconductance stage via a summing element.

The first switching element and the fourth switching element are switched via an input voltage signal, and the second switching element and the third switching element are switched via a feedback signal at a respective control terminal.

In another embodiment, the first differential pair input combination is connected via a voltage node and the second differential pair input combination is connected via a voltage node to a fifth switching element, respectively. The other terminals of the first switching element and the third switching element have a common node and the other terminals of the second switching element and the fourth switching element have a common node. The common nodes are each connected to the third terminal of the transconductance stage via a summing element. The first switching element and the fourth switching element are switched via an input voltage signal, and the second switching element and the third switching element are switched via a feedback signal at a respective control terminal. The fifth switching element is a possible implementation of a power source, for example a current source. The fifth switching element supplies a constant current.

In another embodiment, a sixth switching element is formed on the side of the first differential pair input combination between the voltage node and the fifth switching element and on the side of the second differential pair input combination between the voltage node and the fifth switching element, or the differential pair input combination has a sixth switching element. In an advantageous manner, the power source experiences a data-dependent voltage drop due to the obtained common-mode signal at the voltage node or nodes. The output signal of the energy source actually implemented by the fifth switching element exhibits an undesired dependence of the current on the voltage across the fifth switching element Here, the effect of channel length modulation occurs. If there is data-dependent modulation of the output signal of the energy source, this can, in turn, result in non-linearities. Advantageously, the voltage drop across the fifth switching element can be kept constant, which prevents a possible modulation of the current.

In another embodiment, the sixth switching element of the first and the second differential pair input combination is switched by an output signal of the fifth switching element, amplified by an amplifier. Advantageously, the data-dependent voltage drop at the fifth switching element can be further minimised or eliminated. For this purpose, a gain-boosted cascode can be used, for example. In this case, the amplifier controls the sixth switching element so that a constant and thus data-independent voltage is applied to the fifth switching element. The output signal of the fifth switching element is thus completely data-independent.

In another embodiment, the first switching element and the second switching element are switched via the input voltage signal, and the third switching element and the fourth switching element are switched via the feedback signal. In an advantageous manner, the input signals are combined by the differential stages in such a way that a common-mode signal is no longer applied to the respective voltage nodes. This advantageous design enables the operation of a single energy source at the respective voltage nodes.

A second aspect of the present invention comprises a sigma-delta analogue-to-digital converter according to the present invention for processing audio signals in communication systems, in particular in mobile communication systems.

The invention is explained below with reference to various embodiments, it being noted that these examples include variations or additions as that are directly apparent to the person skilled in the art. Furthermore, these preferred embodiments do not constitute a limitation of the invention in the sense that variations and additions are within the scope of the present invention.

Elements, features and components that are identical, equal in function and equal in effect are marked with the same reference signs in the drawings unless otherwise stated.

Figure 1:
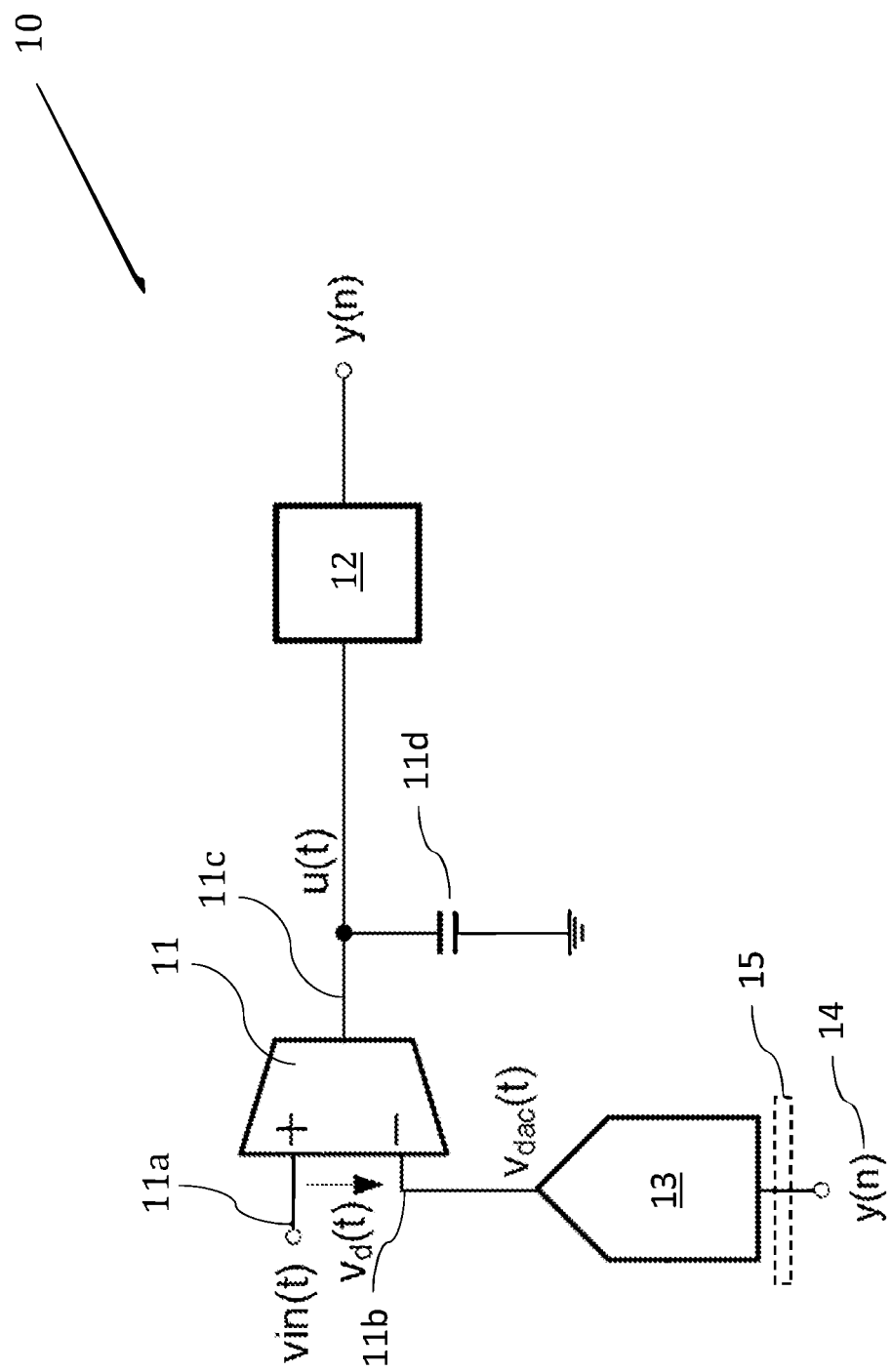
FIG. 1 shows a schematic of a sigma-delta analogue-to-digital converter according to a first embodiment.
Figure 3:
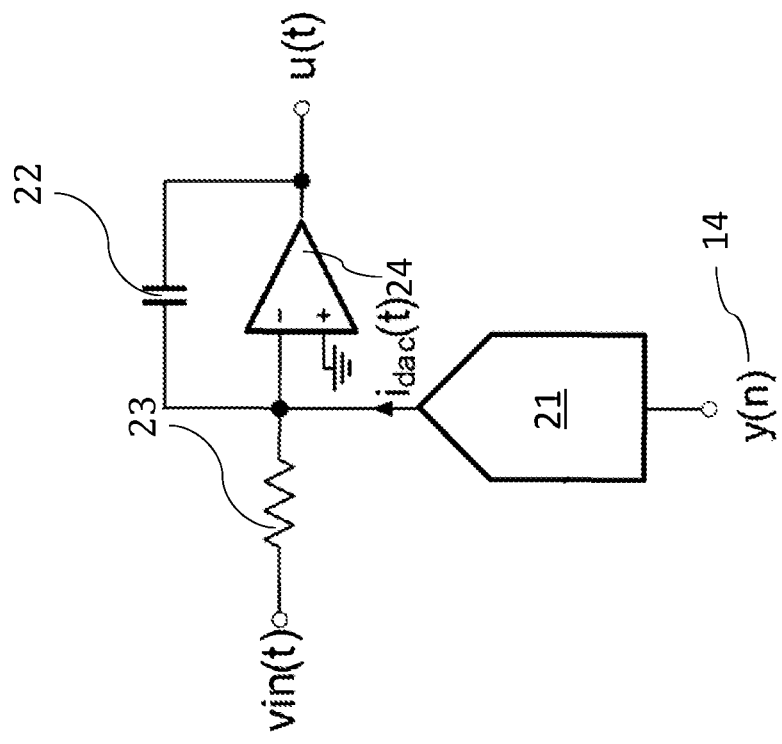
FIG. 3 shows another schematic of a prior art sigma-delta analogue-to-digital converter with an RC integrator.
Figure 2:
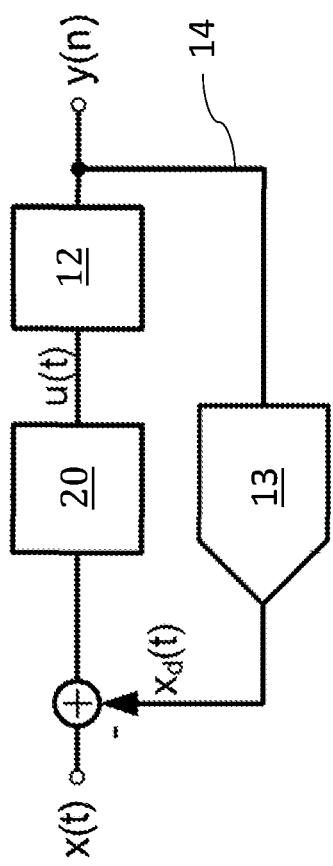
FIG. 2 shows a schematic of a prior art sigma-delta analogue-to-digital converter.

FIG. 1 shows a schematic of a sigma-delta analogue-to-digital converter 10 according to a first embodiment. The sigma-delta analogue-to-digital converter 10 has a transconductance stage 11 (gm stage). The transconductance stage 11 comprises a first input 11a and a second input 11b, and an output 11c. An input signal vin(t), preferably an input voltage, is applied to the input 11a. A digital-to-analogue converter (DAC), in particular a voltage-mode digital-to-analogue converter (VDAC) 13, is connected to the input 11b. The DAC can be designed as an R-2-R-DAC, an M-2-M-DAC or a C-2-C-DAC.

The feedback signal Vdac(t) is provided as a feedback signal via the VDAC 13. The VDAC 13 is designed to generate and provide a voltage from a digital signal, for example a digital "WORD". The sigma-delta analogue-to-digital converter 10 further comprises a quantiser 12. The quantiser 12 is connected in series with the transconductance stage 11. The output signal y(n) of the quantiser 12 is connected to the input of the VDAC 13 via feedback 14. Further, the sigma-delta analogue-to-digital converter 10 comprises a capacitor 11d. The capacitor 11d is connected in parallel with the output of the transconductance stage 11. An output voltage u(t) is provided to the quantiser 12. In an alternative embodiment, the sigma-delta analogue-to-digital converter 10 may include a low-pass filter 15 at the input of the VDAC 13. The low-pass filter 15 may be used to minimise quantisation noise.

With the design shown in FIG. 1, a significant improvement in the performance of the transconductance stage 11 can be achieved. In particular, no input resistor needs to be provided in the illustrated design. Thus, the design is more energy efficient and an improvement in linearity is achieved.

A feedback signal Vdac(t), in particular a voltage, is provided via the VDAC 13. The VDAC 13 converts a digital signal y(n) to a voltage Vdac(t). The VDAC 13 implements a comparison of the voltages vin(t) and the output signal y(n). The resulting effective input signal vd(t) of the transconductance stage 11 (gm stage) is $$vd(t)=vin(t)-vdac(t).$$

Using the feedback of the VDAC 13, the feedback signal Vdac(t) can be made to very closely approach the input signal Vin(t) so that only a voltage difference corresponding to the quantisation error remains. The voltage difference between the input signal Vin(t) and the feedback signal Vdac(t) is thus very small. The feedback signal Vdac(t) thus corresponds to the input signal Vin(t) at the input 11*a* of the transconductance stage 11 plus the quantisation noise, and is obtained as $$Vdac(t)=vin(t)+vq(t),$$

so that the effective input signal corresponds only to the quantisation error as the input signal vd(t)=−vq(t). The quantisation noise can be further minimised using a low-pass filter.

Figure 7:
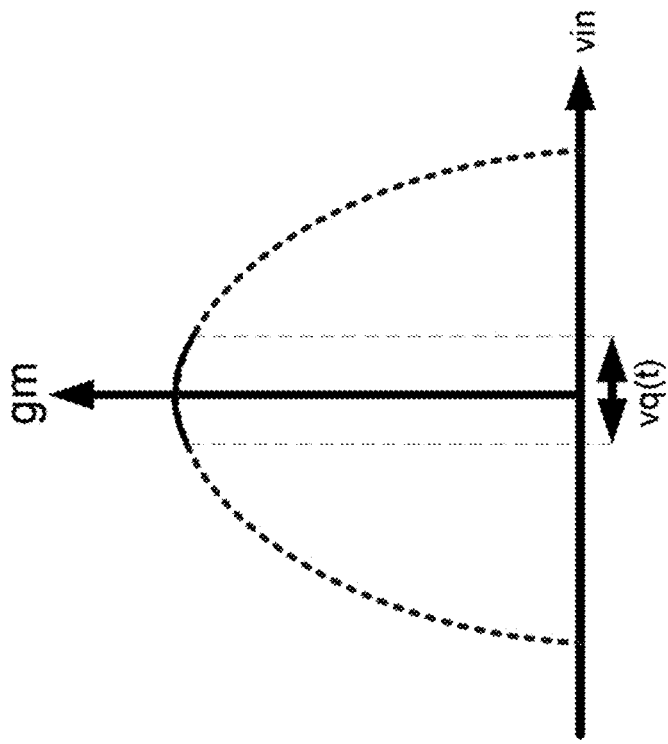
FIG. 7 shows a diagram of the input signal swing of the embodiment shown in FIG. 1.

Thus, advantageously, the modulation level or signal swing applied to the transconductance stage 11 can be minimised. FIG. 7 shows the reduced modulation level. The effective input signal vq(t) of the transconductance stage 11 according to the present invention is considerably flatter than, for example, the input signal of the prior art design according to FIG. 4. In this design, a complete signal swing results as the input signal for the transconductance stage 11, shown in FIG. 6. In the inventive design according to FIG. 1, the input signal Vin(t) and the feedback signal vdac(t) are combined at the transconductance stage 11 in such a way that a common-mode signal is produced at the output. The maximum modulation level of the transconductance stage 11 corresponds to vd(t) or −vq(t). This results in a significant improvement of linearity. FIG. 7 shows that the signal swing is limited to vq(t) with the same input signal vin(t).

Figures 4, 5:
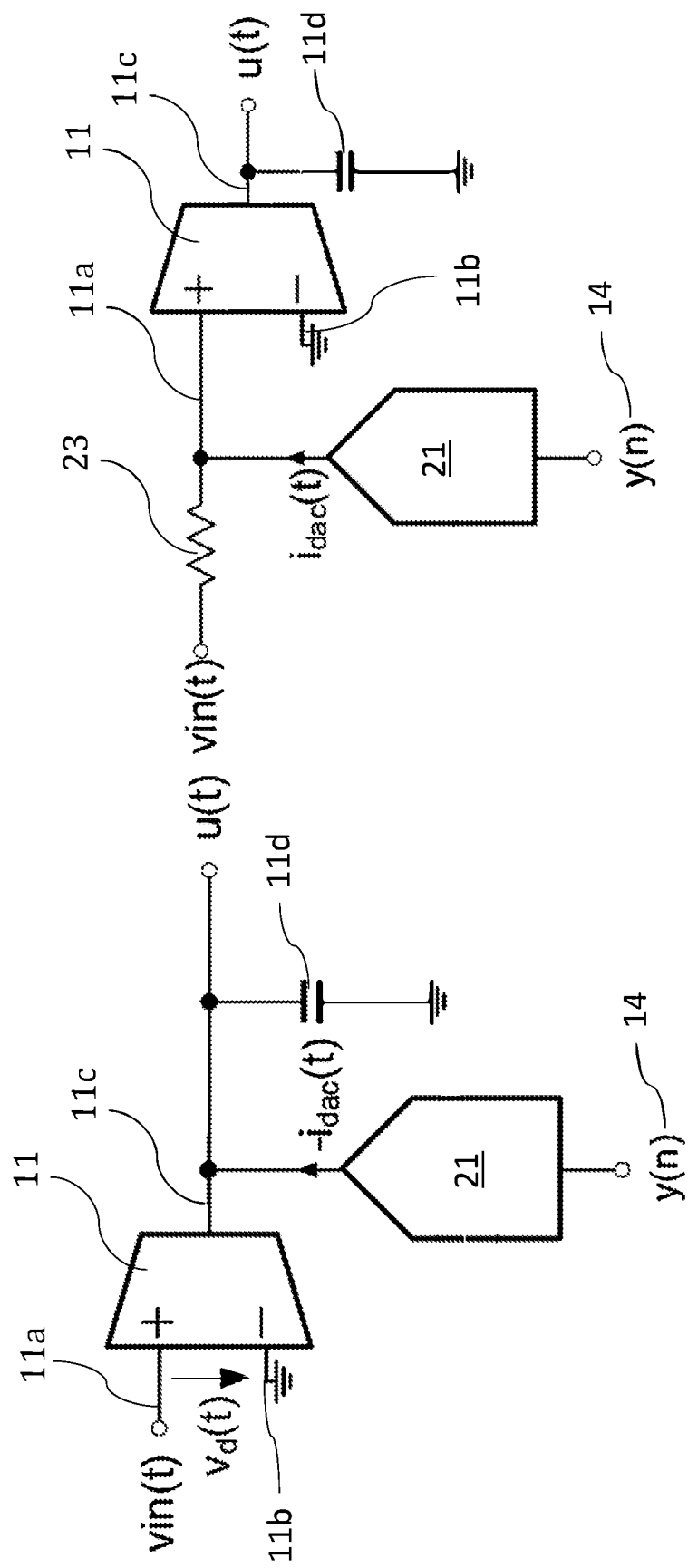
FIG. 4 shows another schematic of a prior art sigma-delta analogue-to-digital converter with a gm-C integrator.
FIG. 5 shows another schematic of a prior art sigma-delta analogue-to-digital converter with a gm-R-C integrator.
Figure 6:
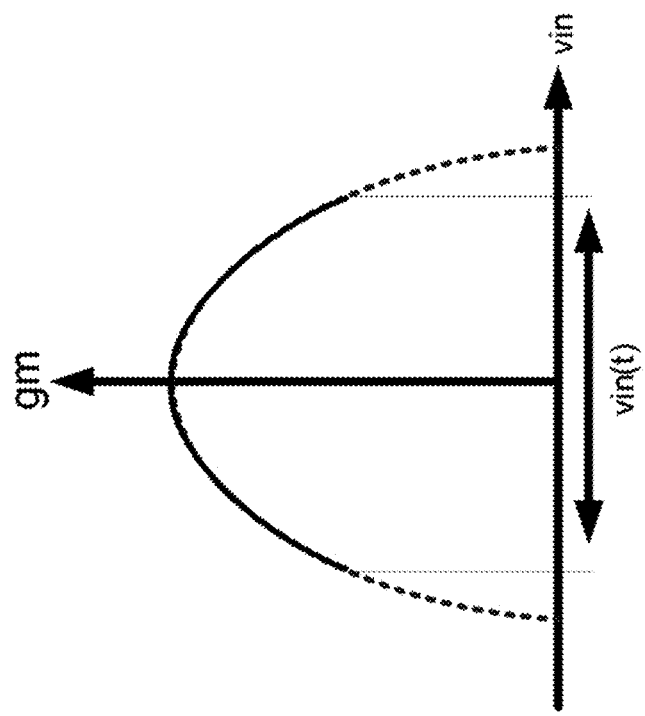
FIG. 6 shows a diagram of the input signal swing of the sigma-delta analogue-to-digital converter with a gm-C integrator shown in FIG. 4.
Figure 8:
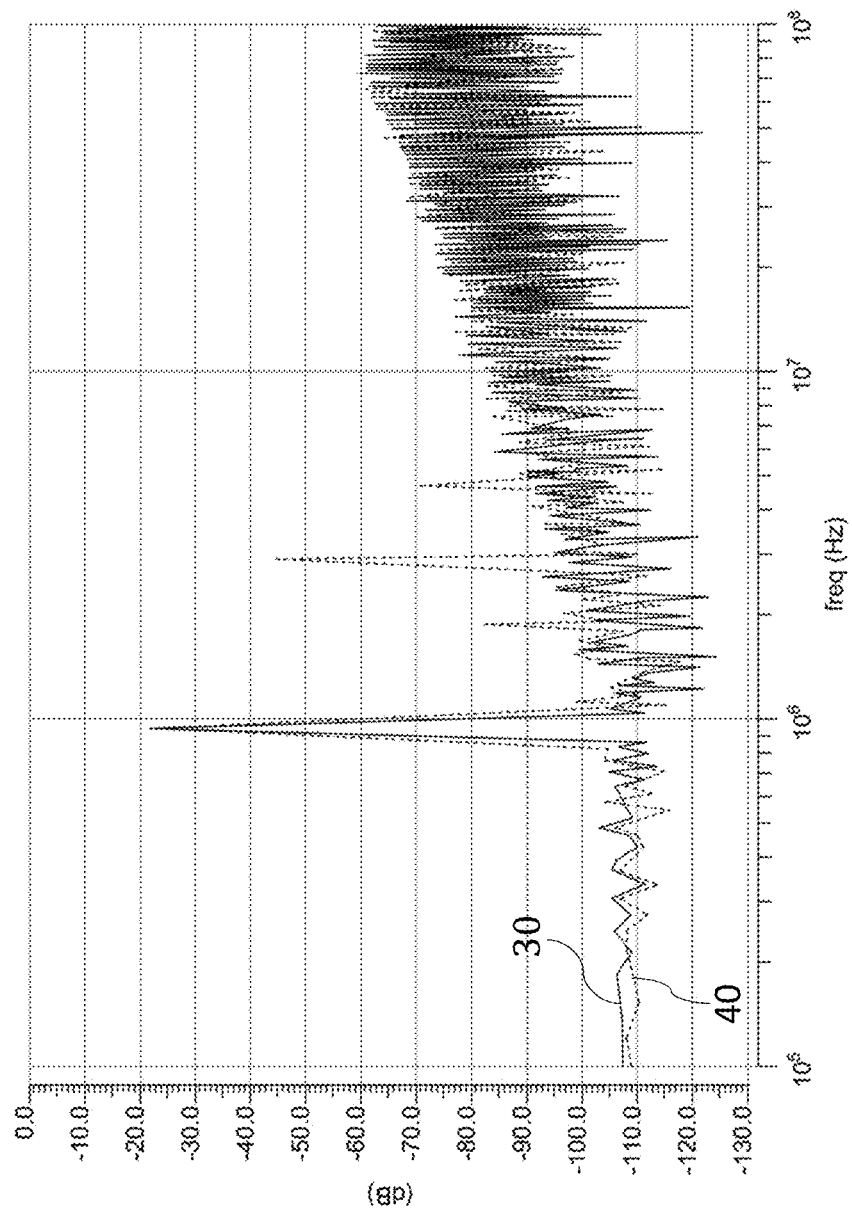
FIG. 8 shows a spectrum of the gm-C integrator shown in FIG. 4 and the embodiment shown in FIG. 1.

FIG. 8 shows a spectrum of the gm-C integrator shown in FIG. 4 and the embodiment of the present invention shown in FIG. 1. The spectrum shown shows the simulation result with a gmC integrator known from prior art according to the design shown in FIG. 4. Reference sign 40 denotes the spectrum of said gmc integrator. Reference sign 30 denotes the spectrum produced with the present invention of a gmVC integrator. Both gm stages have been provided with the same components and are of identical construction. The gm stages differ only in the corresponding circuitry. In the gmVC integrator, a VDAC is provided to switch the voltage signal vdac(t) to the inverting input of the transconductance stage 11. The spectrum 30 of the sigma-delta analogue-to-digital converter with a gmVC integrator exhibits a spectrum without distortion at multiples of the input frequency (1e6 HZ). The spectrum 40 of the gmc integrator known from prior art exhibits harmonic distortion in the frequency response at multiples of the input frequency (1e6 Hz). The largest harmonic distortion is −45 dB. These non-linear distortions result from the lack of linearity, which corresponds to the shape of the parabolic curve in FIG. 6.

Figure 9:
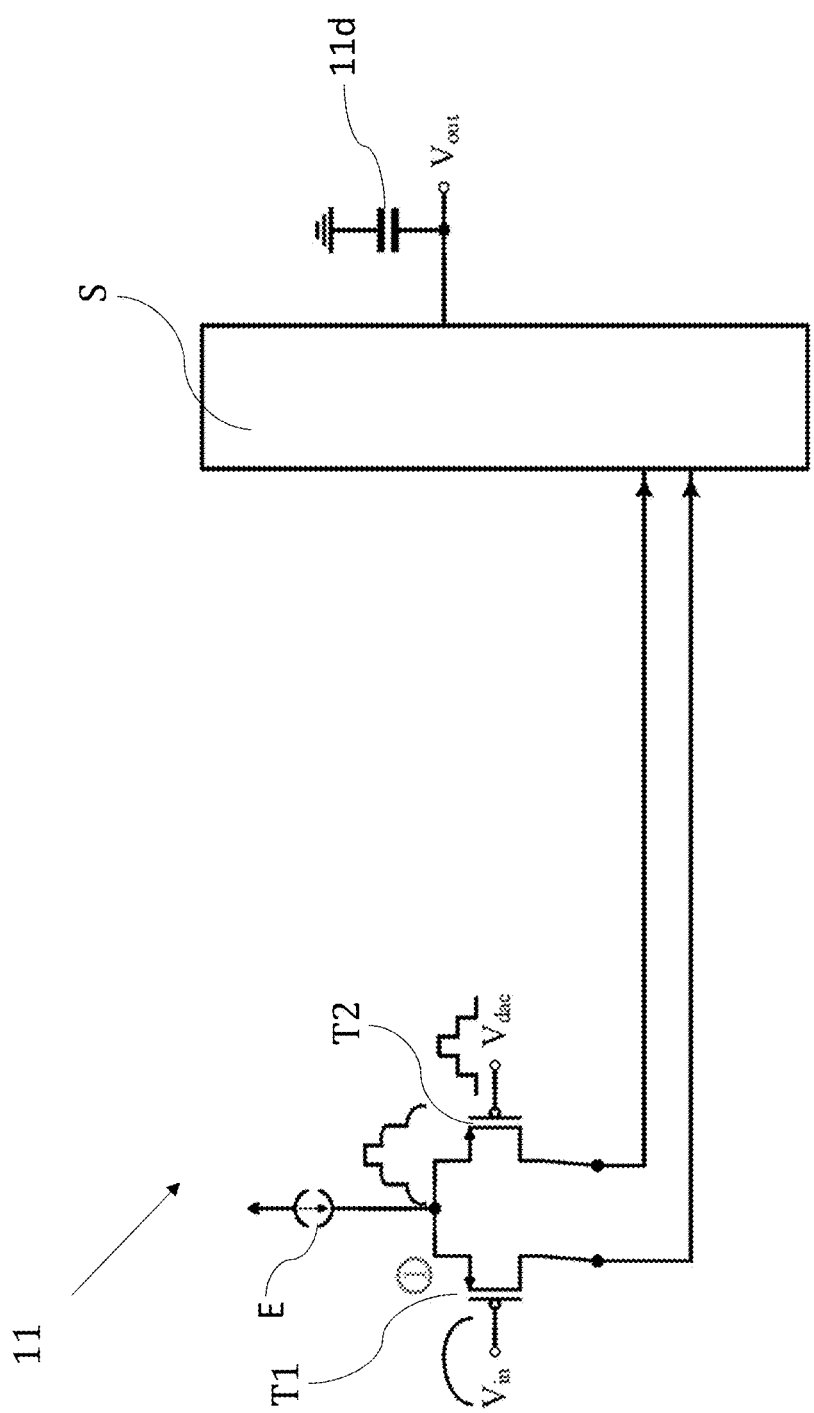
FIG. 9 shows a schematic of a single-ended transconductance stage for one embodiment of the sigma-delta analogue-to-digital converter.

FIG. 9 shows a schematic of a single-ended transconductance stage 11 for one embodiment of the sigma-delta analogue-to-digital converter. In the simplest case, a gm stage consists of a switch, for example a bipolar transistor or a field effect transistor. Other semiconductor switching elements can be used to switch the transconductance stage. A voltage-current conversion is performed by the switching elements T1 and T2. The switching elements T1 and T2 each have a connection to a common voltage node 1 via a first terminal. An energy source E, preferably a current source, is connected via the voltage node 1. The gm is provided with the current of the energy source E via the switching elements T1 and T2. The current results from $$I=\tfrac{1}{2}\cdot gm\cdot V_{overdrive},\text{ where the resulting }V_{overdrive}\text{ is}$$
$$V_{overdrive}=V_{GS}-V_{TH}.$$

The switching elements T1 and T2 each have a further terminal for connecting to a summing element S. The switching element T1 is controlled via the input signal Vin (Vin(t)). The switching element T2 is controlled via the input signal Vdac (Vdac(t)).

The single-ended transconductance stage has a maximum differential signal swing of vin(t)−vdac(t)=vgs1−vgs2=vd (t), so that the branch current of $$+/-gm\cdot vd(t)/2\text{ results.}$$

For switching element 1, the result is: −gm(Vin−Vdac)/2=−gmVd/2.

For switching element 2, the result is: −gm(Vdac−Vin)/2=gmVd/2.

As shown, the input swing reduces the quantisation noise such that the linearity of the gm stage improves significantly. The signal swing drops across the energy source E as shown in FIG. 9.

In the summing element S, the respective differential currents of the first switching element T1 and the second switching element T2 are subtracted from each other, and the resulting current is made available at the third terminal 11*c* of the transconductance stage 11 (cf. FIG. 1). The current at the third terminal 11*c* is integrated by capacitor 11*d*, and converted to the voltage u(t) at the third terminal 11*c*.

Thus, a significant improvement in the performance of the transconductance stage 11 can be achieved. In this regard, the feedback signal is applied to terminal 11*b* (cf. FIG. 1) instead of output 11*c*. Thus, a voltage-mode DAC (VDAC) is required here instead of a current-mode DAC. The feedback signal vdac(t) again corresponds to the input signal plus the quantisation noise vdac(t)=vin(t)+vq(t), so that only the quantisation error corresponds as the input signal vd(t)=vq(t) (FIG. 1). As can be seen from FIG. 7, there is thus a clearly reduced modulation level of the non-linear gm stage, whereby the linearity of the converter is significantly increased (compare FIG. 8).

Figure 10:
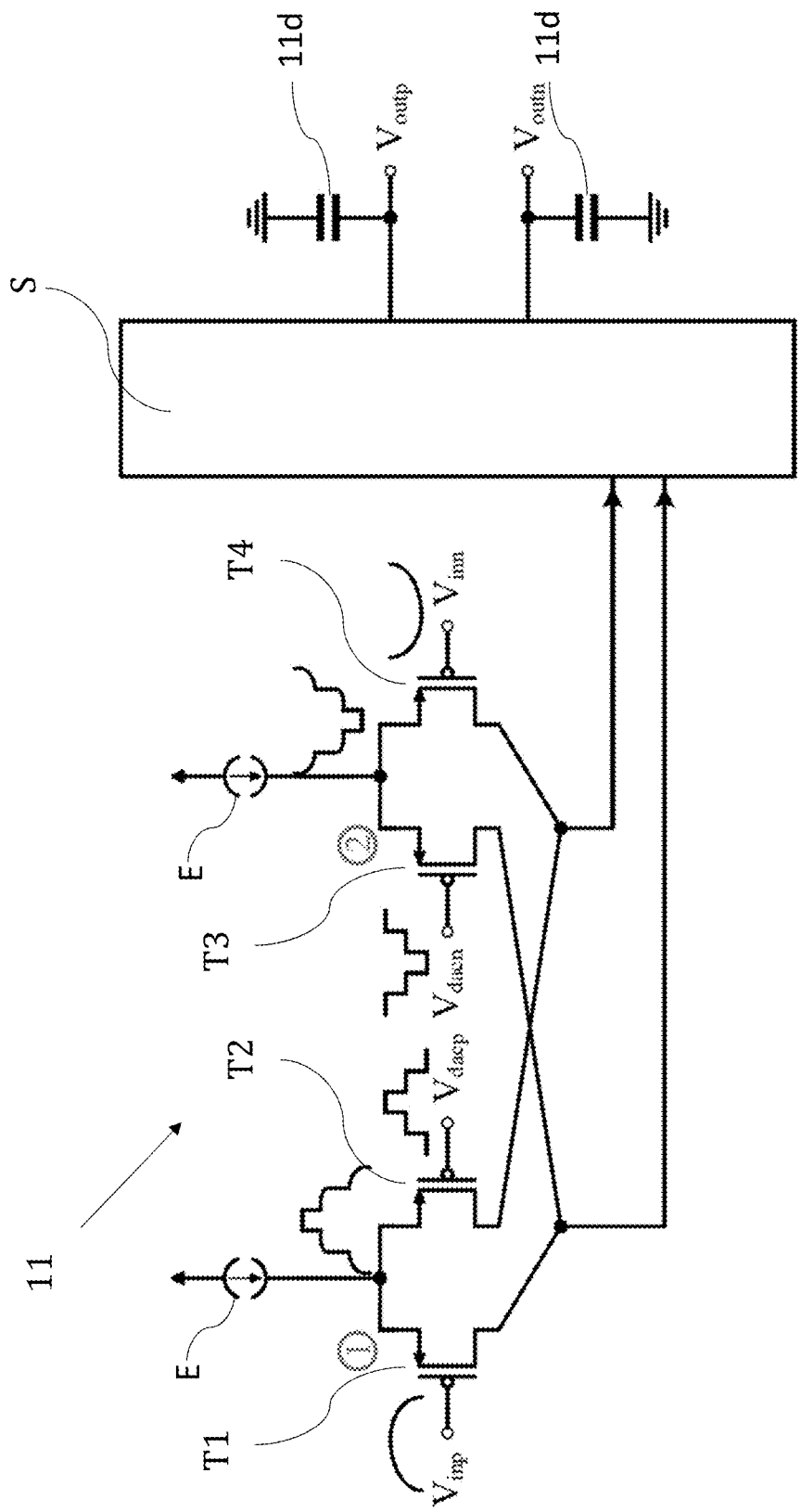
FIG. 10 shows a schematic of a differential transconductance stage for one embodiment of the sigma-delta analogue-to-digital converter.

FIG. 10 shows a schematic of a differential transconductance stage 11 for one embodiment of a sigma-delta analogue-to-digital converter. The transconductance stage 11 comprises a first differential pair input combination and a second differential pair input combination. The first differential pair input combination comprises a first switching element T1 and a second switching element T2. The first switching element T1 and the second switching element T2 have a common voltage node 1 at a respective terminal. An energy source E, preferably a current source, is connected to the voltage node 1. The switching element T1 is connected to the summing element S via a node. The switching element T2 is connected to the summing element S via a further node. The second differential pair input combination comprises a third switching element T3 and a fourth switching element T4. The third switching element T3 and the fourth switching element T4 have a common voltage node 2 at a respective terminal. A further energy source E, preferably a current source, is connected to the common voltage node 2. In an alternative embodiment, the voltage node 1 and the voltage node 2 can be switched via a common energy source E. The switching element T3 is connected to the switching element T1 and the summing element S via a node. The switching element T4 is connected to the switching element T2 and the summing element S via the further node.

Via the summing element S, the two differential currents of the first switching element T1 and the third switching element T3, as well as the second switching element T2 and the fourth switching element T4, are subtracted from each other and made available to the resulting current at the terminal 11c of the transconductance stage 11. This provided current is integrated by capacitor 11d, and converted to the voltage u(t) at the terminal 11c.

According to FIG. 10, the input signal vin(t) and the feedback signal vdac(t) are combined in the transconductance stage 11 in such a way that a common mode signal is established at the node of the differential pair input combination. In this respect, it can be ensured that the maximum modulation level of the transconductance stage 11 corresponds only to the quantisation noise vq(t)=vd(t). The resistance R necessary for source regeneration in the prior art can advantageously be disregarded. Thus, the design of FIG. 10 is more energy efficient, and due to the smaller modulation level of the transconductance stage 11, a significant improvement of the modulator's linearity can be achieved.

The output signals Voutp and Voutn shown in FIG. 10 correspond to the differential terminals of the transconductance stage 11, and thus to a differential view of the third terminal 11c shown with FIG. 1. Mathematically, the output signal at the third terminal 11c corresponds to (Voutp−Voutn). Consequently, the quantiser 12 can be constructed differentially. The input signal Vin(t) and the feedback signal vdac(t) are thus set differentially.

Figure 11:
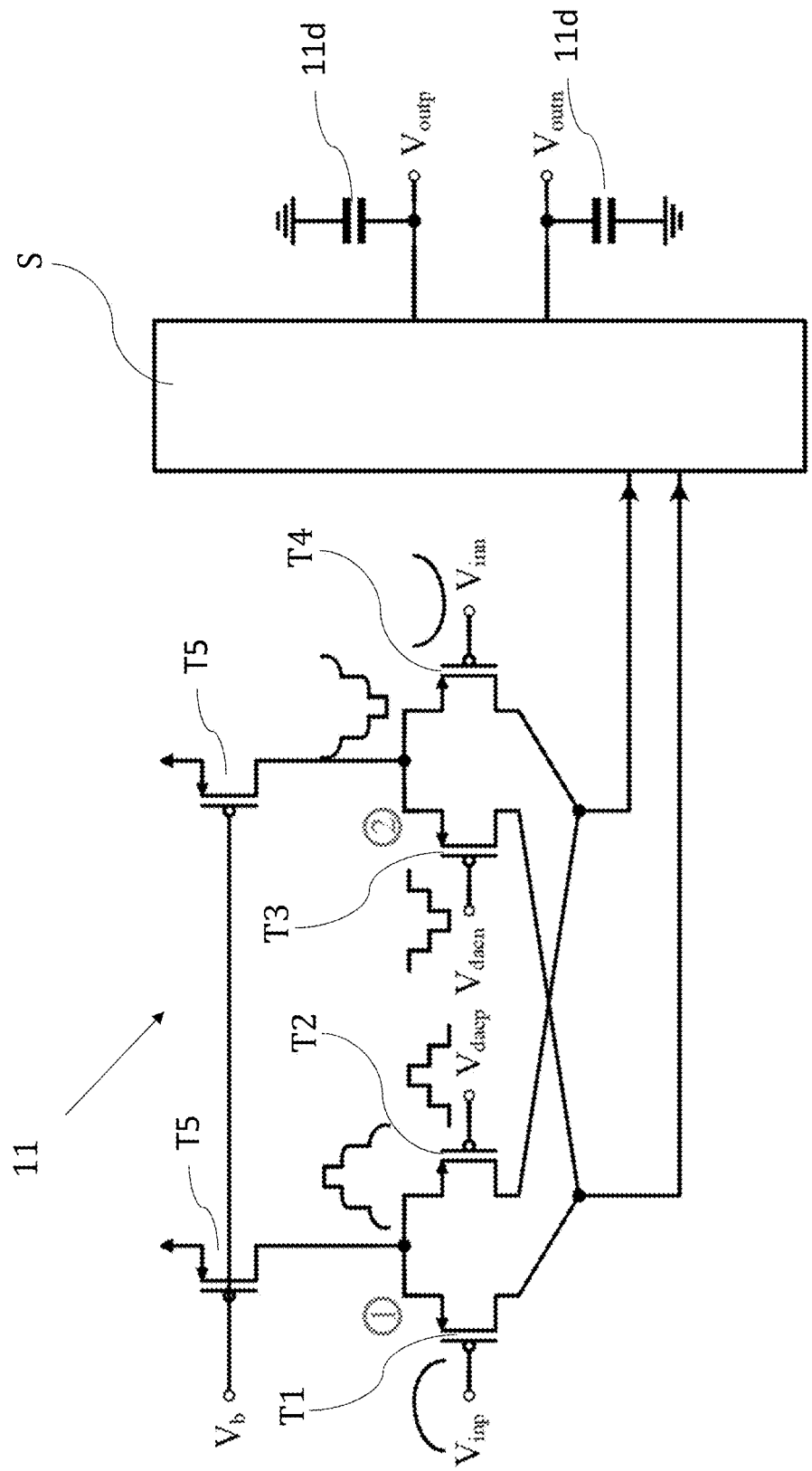
FIG. 11 shows a schematic of another differential transconductance stage for one embodiment of the sigma-delta analogue-to-digital converter.

FIG. 11 shows a schematic of another differential transconductance stage 11 for one embodiment of a sigma-delta analogue-to-digital converter. The design of FIG. 11 comprises the same elements in the same circuitry as the embodiment of FIG. 10. In addition, a further switching element T5 is provided in each differential pair input combination. The switching element T5 is connected to the respective voltage node 1 and 2 via a terminal. The switching element T5 may be implemented, for example, as a bipolar transistor or a field effect transistor. The switching element T5 may be a possible implementation of a current source. In this design, the current through the switching element T5 corresponds to the output signal.

Figure 12:
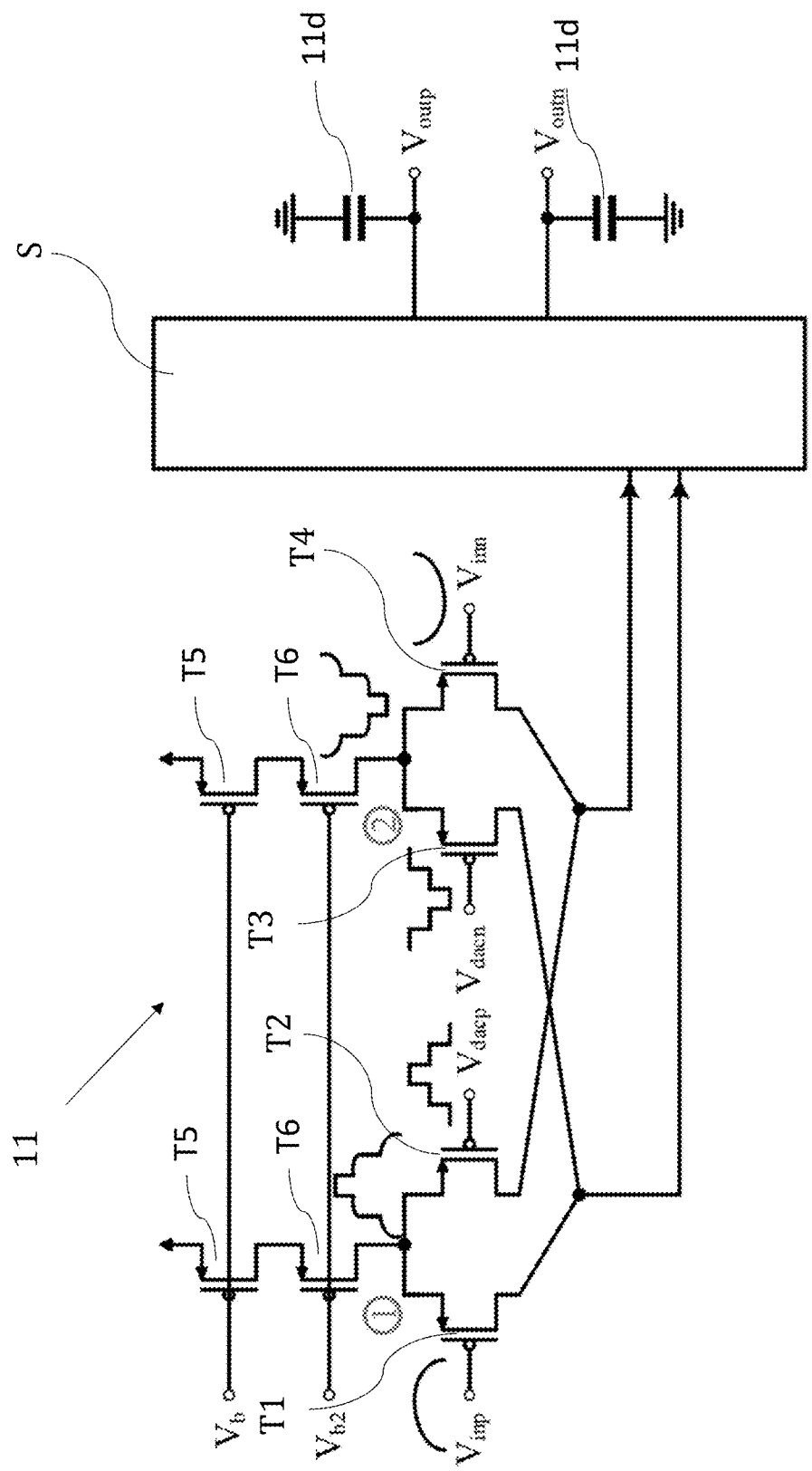
FIG. 12 shows a schematic of another differential transconductance stage for one embodiment of the sigma-delta analogue-to-digital converter.

FIG. 12 shows a schematic of another differential transconductance stage 11 for one embodiment of a sigma-delta analogue-to-digital converter. The transconductance stage 11 has a first differential pair input combination and a second differential pair input combination with a first switching element T1 and second switching element T2, and a third switching element T3 and a fourth switching element T4 as shown in FIG. 11. Further, the transconductance stage 11 has a series connection of the fifth switching element T5 and a sixth switching element T6. The fifth switching element T5 and the sixth switching element T6 can be implemented as a bipolar transistor or field effect transistor. Advantageously, this embodiment makes the ideal current source more efficient through the fifth switching element T5 and the sixth switching element T6. In particular, the Zin is improved by this embodiment. The switching element T5 has a resistance $R_{DS}$ (drain-source resistance). An improved Zin and thus an increased Zin results from the $R_{DS}$ of switching element T5 and the voltage gain $A_{V1}$ of switching element T6 as $Zin=RDS*AV1$. In this respect, the output resistance is improved.

The result is, for:

| | |
|---|---|
| $gm*(Vinp-Vdacp)]=gmVd/2$ | T1/T2 combinations: |
| $gm*[(Vinn-Vdacn)]=-gmVd/2$ | T3/T4 combination: |
| $gm*[(Vinp-Vinn)-(Vdacp-Vdacn)]=$ $gmVd$ | T1/T2/T3/T4 combination: |

Due to the generated common-mode signal at voltage node 1 (cf. FIG. 9) or voltage nodes 1 and 2 in a differential implementation, the energy source E experiences a data-dependent voltage drop. The output signal of the current source actually implemented (switching element T5) shows an undesired dependence of the current on the voltage across the switching element T5. If a data-dependent modulation of the output signal of the current source takes place, this again results in non-linearities. In this respect, any modulation of the current has to be prevented by keeping the voltage drop across the switching element T5 constant in an advantageous manner. In FIG. 12, this data-dependent voltage drop across the switching element T5 is minimised by the cascode transistors T6 keeping the voltage across the switching element T5 constant.

Figure 13:
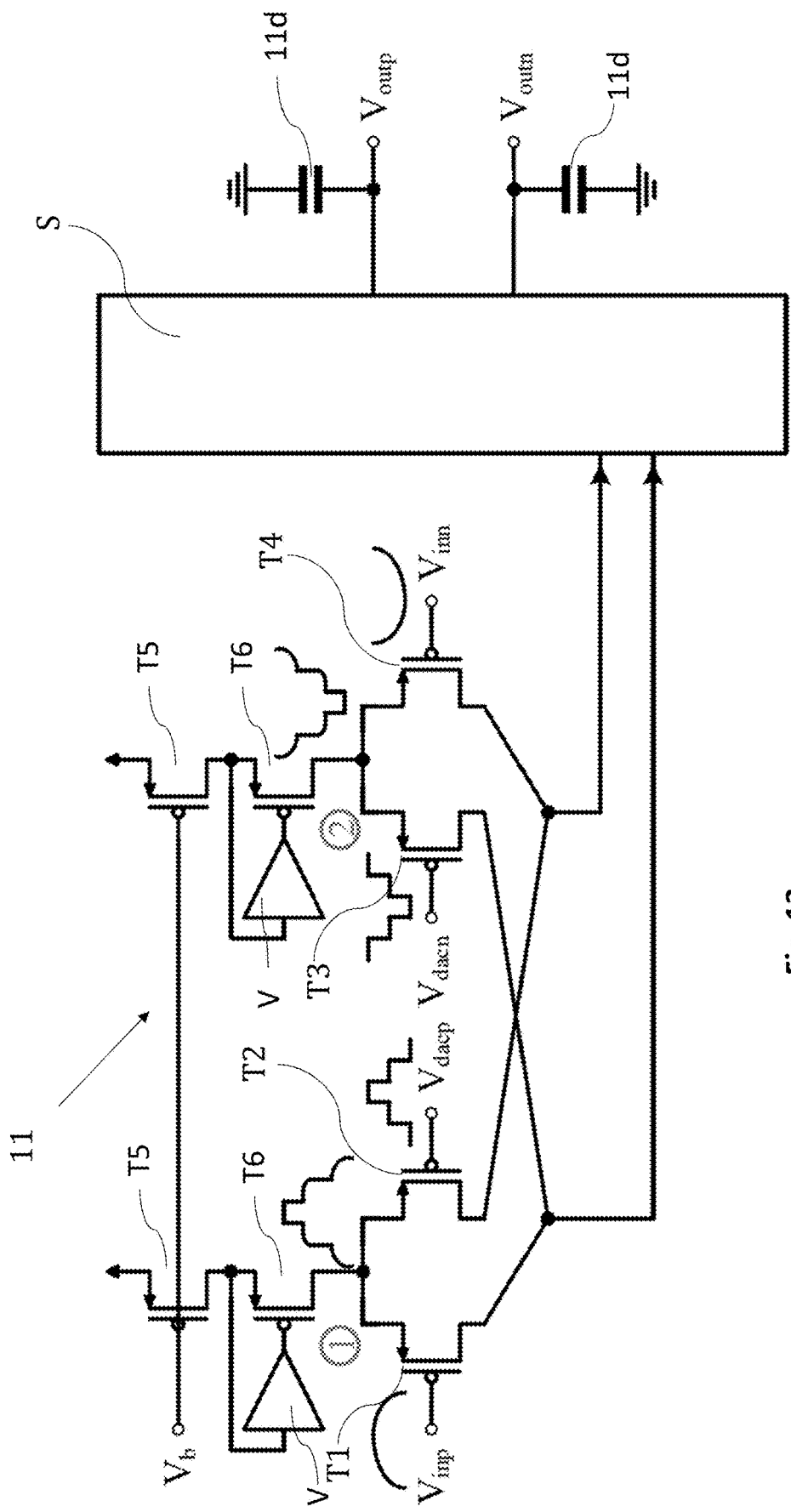
FIG. 13 shows a schematic of another differential transconductance stage for one embodiment of the sigma-delta analogue-to-digital converter.

FIG. 13 shows a schematic of another differential transconductance stage 11 for an embodiment of a sigma-delta analogue-to-digital converter. In addition to the design according to FIG. 12, the transconductance stage has an amplifier V at the control input of the sixth switching element T6. Via the amplifier V, a further voltage gain $A_{V2}$ can be provided, so that the improved Zin results as $Zin=R_{DS}*A_{V1}*A_{V2}$.

The feedback signal Vdac(t) follows the input signal of the digital-to-analogue converter 13 (DAC), so that the voltage nodes 1 and 2 in FIG. 13 move proportionally to the common-mode voltage of each differential pair input configuration. This ensures a constant gate-source voltage VGS of the input transistors. Thus, the transconductance gm modulation across the input voltage is minimised. The influence of the current modulation can be reduced via the cascaded current source used in FIG. 13.

In addition, the data-dependent voltage drop across the switching element T5 can be further minimised or eliminated by the cascaded current source (gain-boosted cascode). Here, the amplifier V controls the switching element T6 so that a constant and thus data-independent voltage is applied to the switching element T5. The output signal of the switching element T5 is thus completely data-independent.

Figure 14:
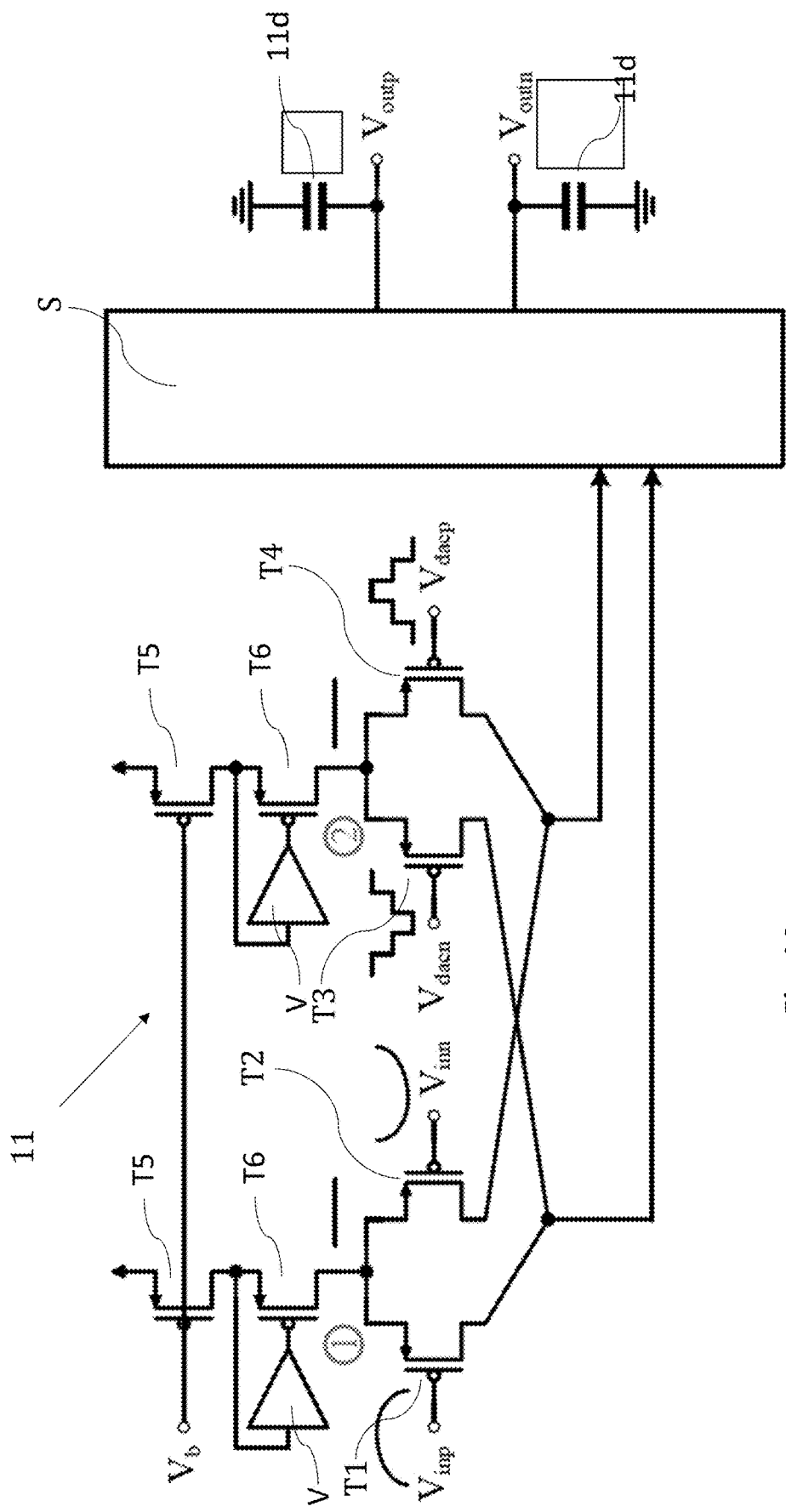
FIG. 14 shows a schematic of another differential transconductance stage of an embodiment of the sigma-delta analogue-to-digital converter.

FIG. 14 shows a schematic of another differential transconductance stage of an embodiment of a sigma-delta analogue-to-digital converter. FIG. 14 shows a differential implementation form with alternative signal control. The transconductance stage of FIG. 14 is designed with the same components as the transconductance stage according to FIG. 13. In FIG. 14, the first switching element T1 is controlled via the input signal Vinp (positive component) and the second switching element T2 via the input signal Vinn (negative component). The third switching element T3 is controlled via the feedback signal Vdacn, and the fourth switching element T4 is controlled via the feedback signal Vdacp. The result is, for:

| | |
|---|---|
| $gm*[(Vinp-Vdinn)$ | T1/T2 combination: |
| $gm*[(Vdacp-Vdacn)$ | T3/T4 combination: |
| $gm*[(Vinp-Vinn)-(Vdacp-Vdacn)]=$ $gmVd$ | T1/T2/T3/T4 combination: |

LIST OF REFERENCE SIGNS 1, 2 Voltage node
10 Sigma-delta analogue-to-digital converter
11 Transconductance stage
11a, 11b, 11c Transconductance stage terminals
11d Capacitor
12 Quantiser
13 Digital-to-analogue converter
14 Feedback
15 Low-pass filter
20 Integrator
21 Current digital-to-analogue converter
22 Capacitor
23 Resistor
24 Operational amplifier
30 Spectrum sigma-delta converter with gmC integrator and IDAC
40 Spectrum sigma-delta converter with gmC integrator VDAC
E Energy source
S Summing element
T1 to T6 Switching elements
Vin(t) Input voltage signal
Vdac(t) Feedback signal

The invention claimed is:

1. A sigma-delta analogue-to-digital converter comprising:
a transconductance stage comprising a first terminal, a second terminal, a third terminal and a capacitor connected in parallel at the third terminal; and
a quantiser at the third terminal of the transconductance stage with a feedback by a voltage digital-to-analogue converter for feeding back a feedback signal to one of the terminals of the transconductance stage;
wherein the first terminal is configured as a non-inverting input and the second terminal is configured as an inverting input, and wherein the non-inverting input is configured to receive an analogue input voltage signal and the inverting input is connected to the digital-to-analogue converter;
wherein the transconductance stage is configured as a single-ended transconductance stage with a first switching element and a second switching element; and
wherein the first switching element and the second switching element are connected to a power source by a terminal via a voltage node and to the third terminal of the transconductance stage by a further terminal in each case via a summing element, and the first switching element is switched via the input voltage signal and the second switching element is switched via the feedback signal at a respective control terminal.

2. The converter according to claim 1, wherein a maximum modulation level of the transconductance stage corresponds to a difference between the received input voltage signal and the feedback signal.

3. The converter according to claim 1, wherein in the feedback a low-pass filter is connected between the quantiser and the digital-to-analogue converter.

4. A sigma-delta analog-to-digital converter according to claim 1 for processing audio signals in communication systems, in particular in mobile communication systems.

5. A sigma-delta analogue-to-digital converter comprising:
a transconductance stage comprising a first terminal, a second terminal, a third terminal and a capacitor connected in parallel at the third terminal; and
a quantiser at the third terminal of the transconductance stage with a feedback by a voltage digital-to-analogue converter for feeding back a feedback signal to one of the terminals of the transconductance stage;
wherein the first terminal is configured as a non-inverting input and the second terminal is configured as an inverting input, and wherein the non-inverting input is configured to receive an analoque input voltage signal and the inverting input is connected to the digital-to-analogue converter:
wherein the transconductance stage is configured as a differential transconductance stage having a first differential pair input combination comprising a first switching element and a second switching element interconnected in each case via a first terminal, and a second differential pair combination comprising a third switching element and a fourth switching element interconnected in each case via a first terminal.

6. The converter according to claim 5, wherein the first differential pair input combination is connected via a voltage node and the second differential pair input combination is connected via a voltage node to a power source, respectively, and wherein the further terminals of the first switching element and the third switching element have a common node and further terminals of the second switching element and the fourth switching element have a common node, and wherein the common nodes are each connected to the third terminal of the transconductance stage via a summing element, and the first switching element and the fourth switching element are switched via the input voltage signal and the second switching element and the third switching element are switched via the feedback signal at a respective control terminal.

7. The converter according to claim 5, wherein the first differential pair input combination is connected via a voltage node and the second differential pair input combination is connected via a voltage node to a fifth switching element, respectively, and wherein further terminals of the first switching element and the third switching element have a common node and further terminals of the second switching element and the fourth switching element have a common node, and wherein the common nodes are each connected to the third terminal of the transconductance stage via a summing element, and the first switching element and the fourth switching element are switched via the input voltage signal, and the second switching element and the third switching element are switched via the feedback signal at a respective control terminal.

8. The converter according to claim 7, wherein the first differential pair input combination between the voltage node and the fifth switching element and the second differential pair input combination between the voltage node and the fifth switching element each comprise a sixth switching element.

9. The converter according to claim 8, wherein the sixth switching element of the first and the second differential pair input combination are switched by an output signal of the fifth switching element, amplified by an amplifier.

10. The converter according to claim 9, wherein the first switching element and the second switching element are switched via the input voltage signal and the third switching element and the fourth switching element are switched via the feedback signal.

11. A sigma-delta analog-to-digital converter according to claim 5 for processing audio signals in communication systems, in particular in mobile communication systems.

12. The converter according to claim 5, wherein a maximum modulation level of the transconductance stage corresponds to a difference between the received input voltage signal and the feedback signal.

13. The converter according to claim 5, wherein in the feedback a low-pass filter is connected between the quantiser and the digital-to-analogue converter.

* * * * *